United States Patent
Yeo et al.

(10) Patent No.: US 9,564,317 B1
(45) Date of Patent: Feb. 7, 2017

(54) METHOD OF FORMING A NANOWIRE

(71) Applicant: Taiwan Semiconductor Manufacturing Company, Ltd., Hsin-Chu (TW)

(72) Inventors: Yee-Chia Yeo, Hsinchu (TW); Blandine Duriez, Brussels (BE); Martin Christopher Holland, Bertem (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/957,312

(22) Filed: Dec. 2, 2015

(51) Int. Cl.
  *H01L 21/4763* (2006.01)
  *H01L 21/02* (2006.01)
  *H01L 21/768* (2006.01)

(52) U.S. Cl.
  CPC ... *H01L 21/02603* (2013.01); *H01L 21/76877* (2013.01)

(58) Field of Classification Search
  CPC ...... H01L 29/02; H01L 29/04; H01L 29/0665; H01L 29/0669; H01L 29/0676; H01L 29/0684; H01L 21/02603; H01L 21/76877; H01L 29/42392
  See application file for complete search history.

(56) References Cited

U.S. PATENT DOCUMENTS

| | | | |
|---|---|---|---|
| 7,425,740 B2 | 9/2008 | Liu et al. | |
| 7,585,334 B2 * | 9/2009 | Catchmark | B81B 1/00 29/25.01 |
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,652,337 B1 * | 2/2014 | Afzali-Ardakani | H01B 13/06 216/17 |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |

(Continued)

*Primary Examiner* — Reema Patel
*Assistant Examiner* — Syed Gheyas
(74) *Attorney, Agent, or Firm* — Haynes and Boone, LLP

(57) ABSTRACT

A method of fabricating a semiconductor device is disclosed. The method includes forming a first material layer over a substrate. The first material layer has a sidewall defining a first opening, wherein the first opening has a first shape. The method also includes forming a sacrificial feature within the first opening and the sacrificial feature has a second shape, which is different than the first shape such that there is a cavity between an edge of the sacrificial feature and the sidewall of the first material layer. The method also includes filling in cavity with a second material layer, removing the sacrificial feature to form a second opening, filling in the second opening with a third material layer, removing the second material layer to reveal the cavity and forming a conductive feature within the cavity.

20 Claims, 15 Drawing Sheets

(56) References Cited

U.S. PATENT DOCUMENTS

| | | | |
|---|---|---|---|
| 2011/0222179 A1* | 9/2011 | Monadgemi | B29D 11/00596 |
| | | | 359/850 |
| 2011/0257040 A1* | 10/2011 | Turner | B01J 19/0046 |
| | | | 506/16 |
| 2012/0057163 A1* | 3/2012 | Cheng | B82Y 15/00 |
| | | | 356/445 |
| 2013/0285153 A1 | 10/2013 | Lee et al. | |
| 2014/0151705 A1* | 6/2014 | Xiao | B82Y 10/00 |
| | | | 257/64 |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2014/0367834 A1* | 12/2014 | Patolsky | H01L 21/02603 |
| | | | 257/618 |
| 2015/0000963 A1* | 1/2015 | Lee | H05K 1/0274 |
| | | | 174/253 |
| 2015/0187762 A1* | 7/2015 | Wahl | H01L 27/088 |
| | | | 257/9 |
| 2015/0249139 A1* | 9/2015 | Cheng | H01L 29/42392 |
| | | | 438/504 |

* cited by examiner

METHOD OF FORMING A NANOWIRE

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs.

Such scaling down has also increased the complexity of processing and manufacturing ICs and, for these advances to be realized, similar developments in IC processing and manufacturing are needed. For example, a three dimensional transistor, such as a semiconductor device with nanowires, has been introduced to replace a planar transistor. Although existing methods of fabricating IC devices have been generally adequate for their intended purposes, they have not been entirely satisfactory in all respects. For example, it is desired to have improvements in the formation of nanowires.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
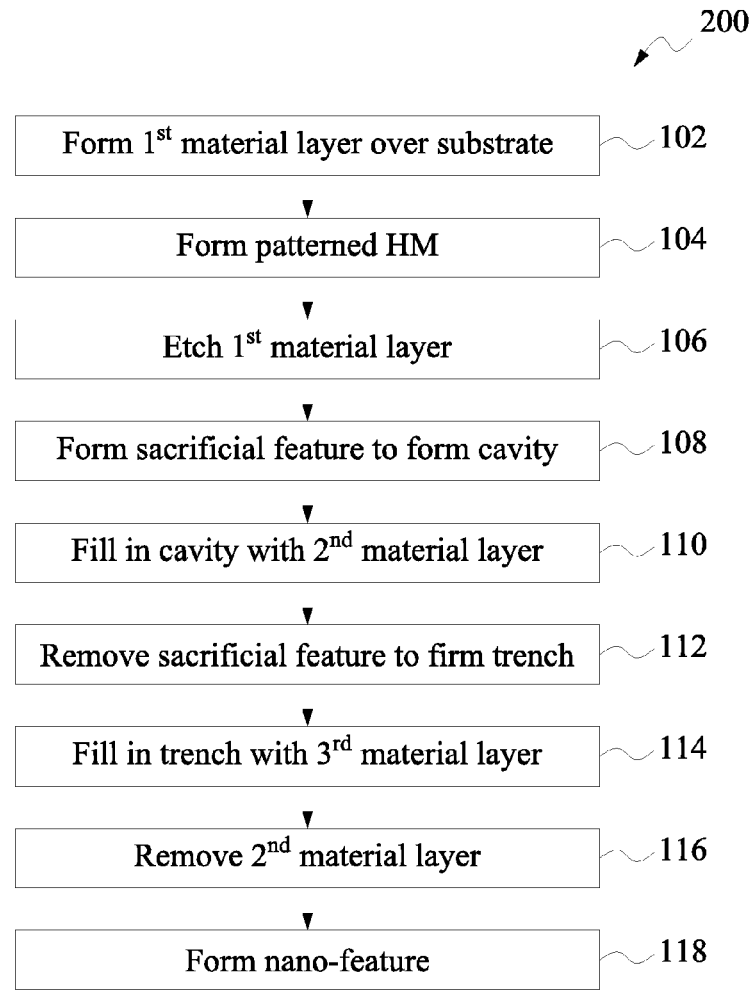
FIG. 1 is a flow chart of a method of fabricating a device or portion provided according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a method 100 of semiconductor fabrication including fabrication of nanowires for a multi-gate transistor referred to as a gate-all-around (GAA) device. FIGS. 3A, 4A, 4C, 5A, 5C, 5D, 6A, 7A, 8A, 9A, 10A, 10C, 10D and 11A are top views of an embodiment of a semiconductor device 200 according to various stages of method 100 of FIG. 1. FIGS. 2, 3B, 4B, 4D, 5B, 6B, 7B, 8B, 9B, 10B and 11B are cross-section views, corresponding to respective isometric views listed above, of an embodiment of the semiconductor device 200 according to various stages of method 100 of FIG. 1. As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including n-type field effect transistors (NFET), p-type field effect transistors (PFET), etc., which may be interconnected.

Figure 2:
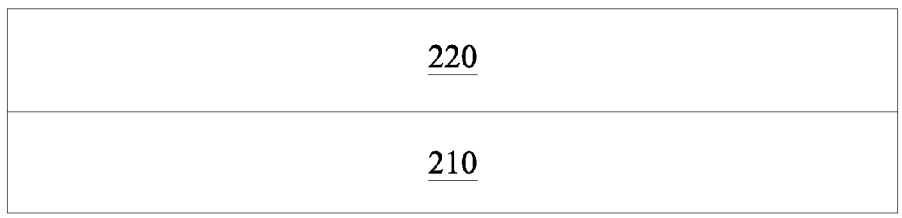
FIG. 2 is a cross-section view of an embodiment of a device 200 according to aspects of the method of FIG. 1

Referring to FIGS. 1 and 2, method 100 begins at step 102 by forming a first material layer 220 over a substrate 210. The substrate 210 may be a semiconductor substrate such as a silicon substrate. The substrate 210 may also include other semiconductors such as germanium, silicon carbide (SiC), silicon germanium (SiGe), or diamond. Alternatively, the substrate 210 may include a compound semiconductor and/or an alloy semiconductor. Further, the substrate 210 may optionally include an epitaxial layer (epi-layer), may be strained for performance enhancement, may include a silicon-on-insulator (SOI) structure, and/or have other suitable enhancement features. The substrate 210 may have any suitable crystallographic orientation (e.g., (100), (110), or (111) crystallographic orientation). In some embodiments, the substrate 210 includes semiconductor material with (111) crystallographic orientation. As an example, the substrate 210 includes Si (111).

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various IC devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

In the present embodiment, the first material layer 220 may include a material which is different from the substrate 210 to achieve etching selectivity during subsequent etch processes. The first material layer 220 may include silicon oxide, silicon nitride, silicon oxynitride, fluorine-doped silicate glass (FSG), a low-k dielectric, silicon carbide, titanium oxide, titanium nitride, tantalum oxide, tantalum nitride, combinations thereof, and/or other suitable materials. In various examples, the first material layer 220 may be deposited by CVD), ALD, PVD, thermal oxidation, spin-on coating, combinations thereof, or other suitable techniques.

Figure 3A:
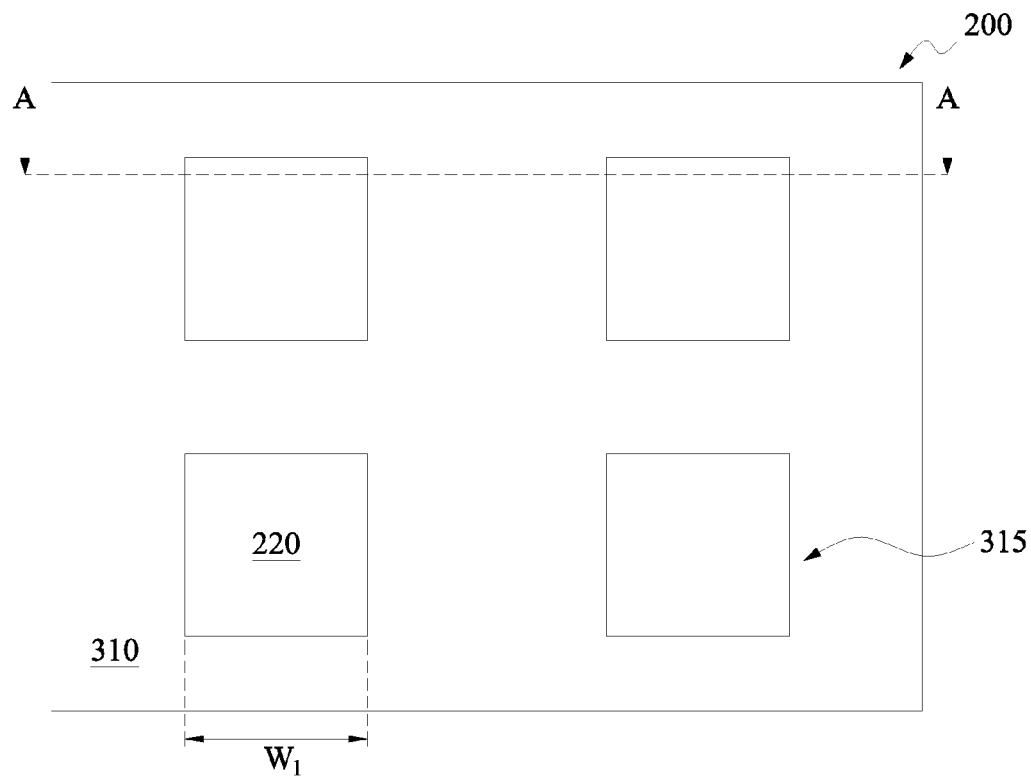
FIGS. 3A, 4A, 4C, 5A, 5C, 5D, 6A, 7A, 8A, 9A, 10A, 10C, 10D and 11A are top views of an embodiment of the device 200 according to aspects of the method of FIG. 1.
Figure 3B:
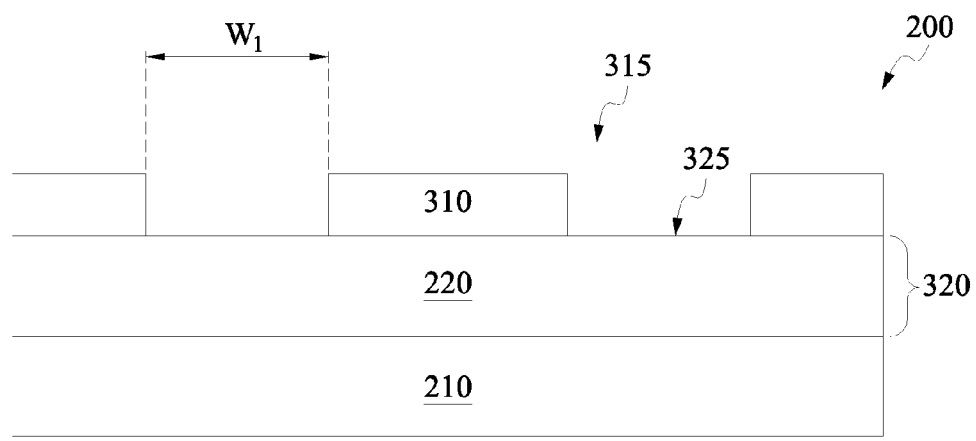
FIGS. 3B, 4B, 4D, 5B, 6B, 7B, 8B, 9B, 10B and 11B are cross-section views, corresponding to the top view of 3A, 4A, 4C, 5A, 6A, 7A, 8A, 9A, 10A and 11A, along line A-A, respectively, of an embodiment of the device 200 according to aspects of the method of FIG. 1.

Referring to FIGS. 1, 3A and 3B, method 100 proceeds to step 104 by forming a patterned hard mask (HM) 310 over the first material layer 220. The patterned HM 310 has a plurality of first openings 315. In some embodiments, each of the first openings 315 has a square shape. Alternatively, the openings 315 may have triangle shapes, circular shapes, and/or other suitable shapes. In the present embodiment, the first opening 315 has a first width $w_1$ along the line A-A. In some embodiments, the patterned HM 310 may include a patterned photoresist layer and formed by a by a lithography process. An exemplary lithography process may include forming a photoresist layer, exposing the photoresist layer by a lithography exposure process, performing a post-exposure bake process, and developing the photoresist layer to form the patterned resist layer. Alternatively, the patterned HM 310 may be formed by depositing a HM layer, forming a patterned photoresist layer over the HM layer by a lithography process and etching the HM material layer through the patterned photoresist layer to form the patterned HM 310.

Figure 4A:
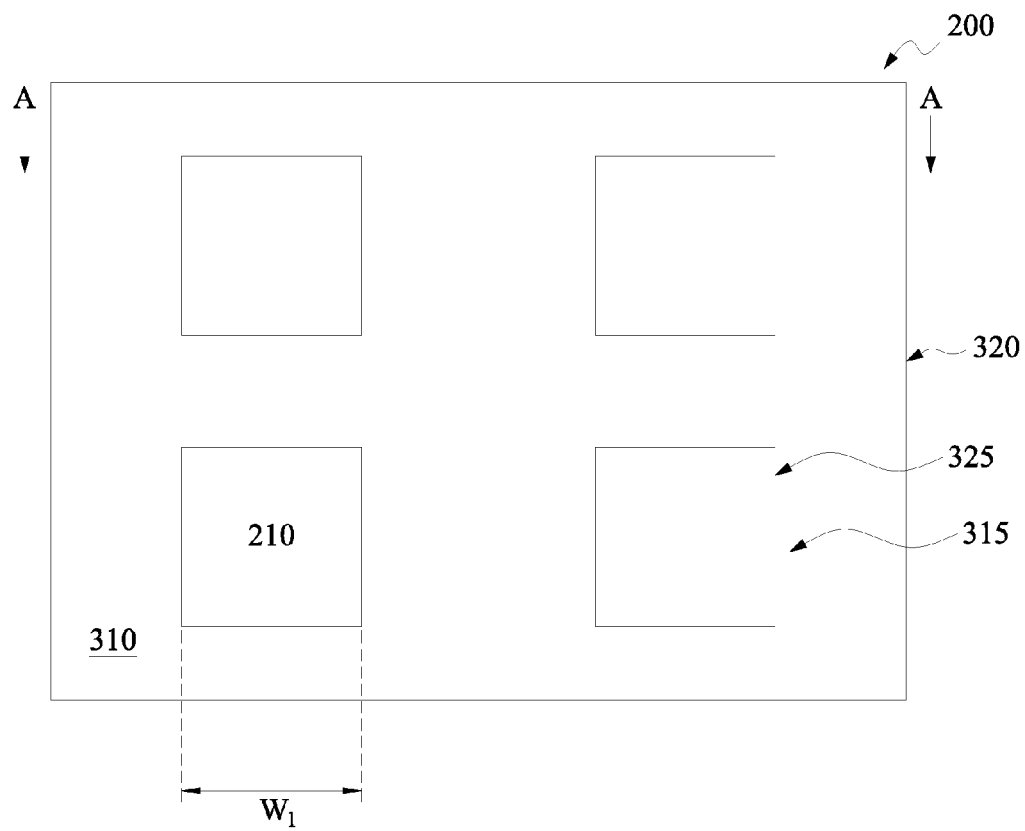
Figure 4B:
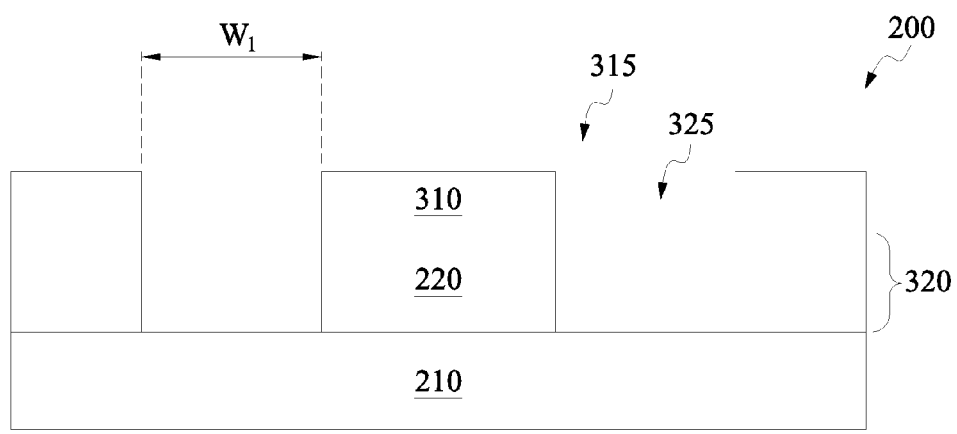

Referring to FIGS. 1, 4A and 4B, method 100 proceeds to step 106 by etching the first material layer 220 to transfer the first opening 315 to the first material layer 220 to form a first template 320. The first template 320 is formed by a plurality of the second openings 325, defined by sidewalls 326, in the first material layer 220. The second opening 325 carry the shape of the first opening 315 and the first width $w_1$. In some embodiments, the etch process is chosen to selectively etch the first material layer 220 without substantially etch the substrate 210. As has been mentioned previously, with an adequate etch selectivity, the substrate 210 serves as an etch stop layer, which improves etch process window and profile control. In some embodiments, the etch process includes an anisotropic dry etch. For example, the etch process is a plasma anisotropic etch by implementing fluorine-containing gas (e.g., $CF_4$, $SF_6$, $CH_2F_2$, $CHF_3$, and/or C2F6), other suitable gases and/or plasmas, and/or combinations thereof.

Figure 4C:
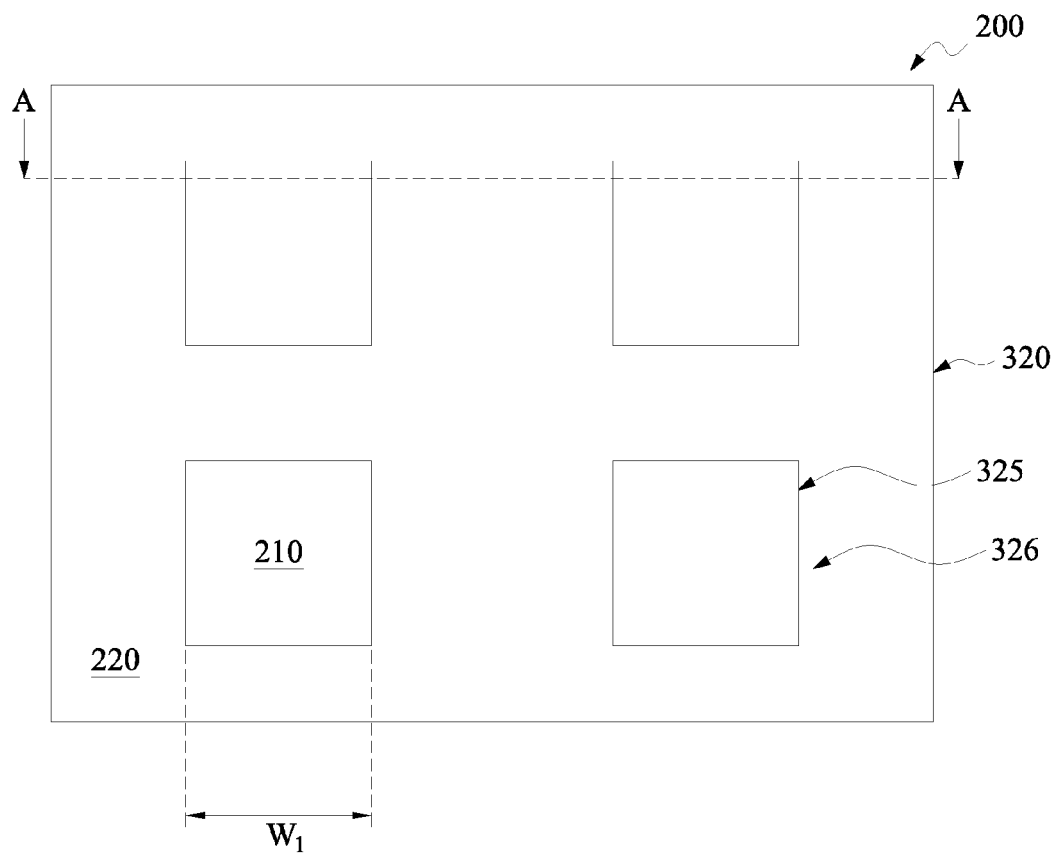
Figure 4D:
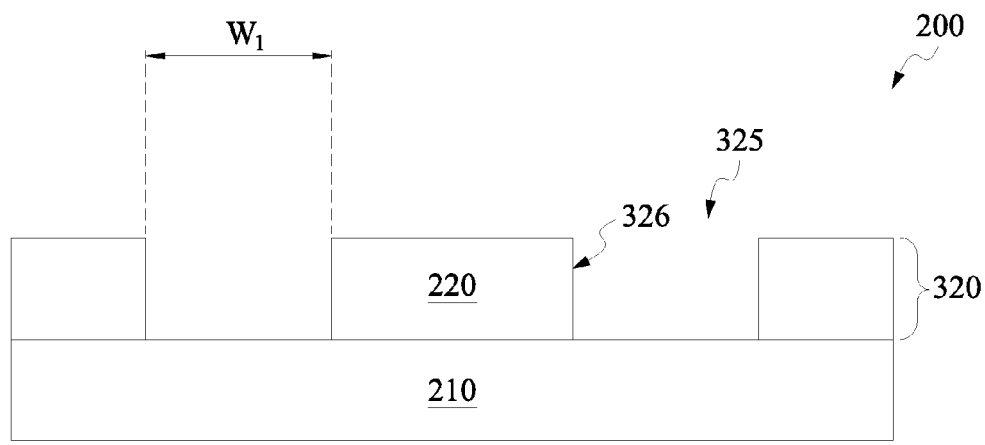

After etching the first material layer 220, the patterned HM 310 is removed by an etch process, as shown in FIGS. 4C and 4D. In one example where the patterned HM 310 is a photoresist pattern, the patterned HM 310 is removed by wet stripping and/or plasma ashing.

Figure 5A:
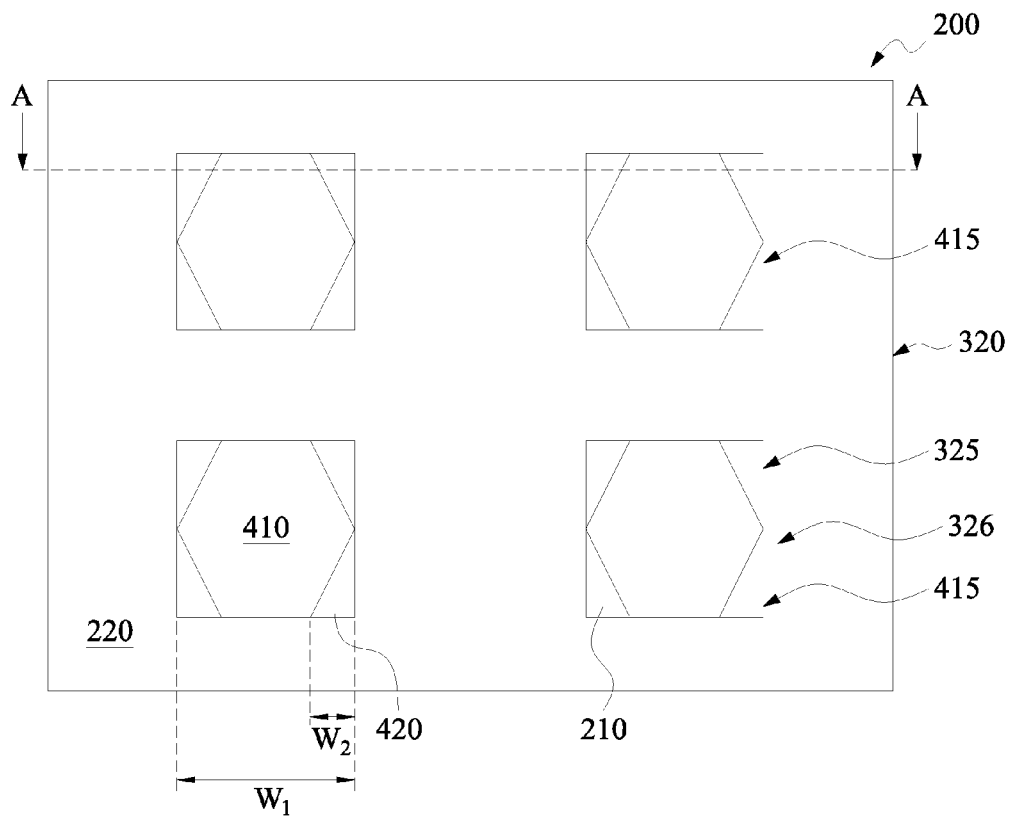
Figure 5B:
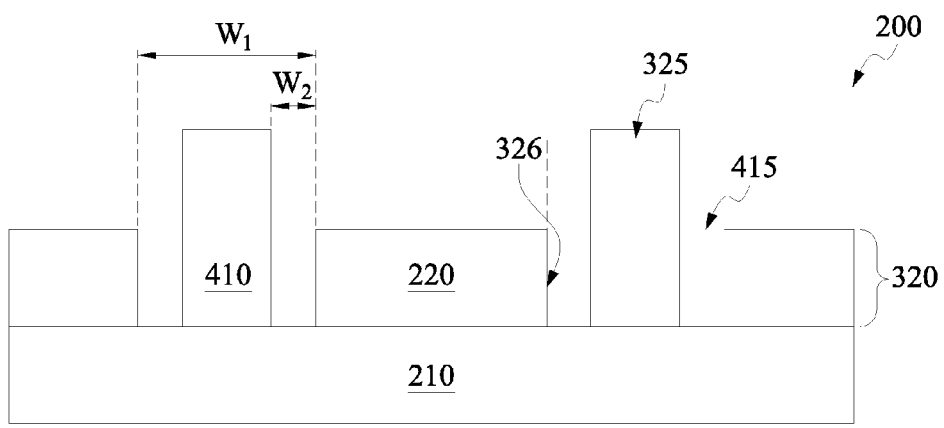

Referring to FIGS. 1, 5A and 5B, method 100 proceeds to step 108 by forming a sacrificial feature 410 within the second openings 325. In the present embodiments, the sacrificial feature 410 is formed with a different type of shape than the type of shape of the second opening 325 such that the sacrificial feature 410 does not completely fill the second opening 325 and leaves cavities (or interstices) 415 between edges of the sacrificial feature 410 and sidewalls 326 of the second opening 325. Therefore a size of the cavity 415 may be controlled by sizes of the sacrificial feature 410 and the second opening 325. In some embodiments, a single sacrificial feature 410 is formed within one second opening 325. Alternatively, in some embodiments, more than one sacrificial feature 410 is formed within one second opening 325.

In the present embodiment, the cavity 415 is formed with a non-uniform-width shape and its dimension along the direction of line A-A is defined as a second width $w_2$. As a result, the second width $w_2$ is substantially smaller than the first width $w_1$. The second width $w_2$ will be related to a diameter of a final nanowire, which will be described later. In some embodiments, the second width $w_2$ is less than 30% of the first width $w_1$. As an example, the first width $w_1$ is in a range from 30 nm to 100 nm and the second width $w_2$ is in a range from 5 nm to 30 nm. It is noted here that this dimension reduction (from the first width $w_1$ to the second width $w_2$) is achieved from the difference of two structures: the second opening 325 and the sacrificial feature 410. In other words, this dimension reduction is achieved by a non-lithography process. This dimension reduction via a non-lithography process is significant in that it allows for the utilization of smaller critical dimensions (CD). CD reduction is a challenge for lithography process, which become one of the limiting factors for future technology generations or nodes. Thus, the present disclosure provides a CD reduction method with a relaxed lithography process.

FIGS. 5A and 5B illustrate the hexagonal-shape epitaxial sacrificial features 410 are formed in square-shape second openings 325. In some embodiments, the sacrificial feature 410 is formed by epitaxial growing a semiconductor material over the semiconductor substrate 210 having (111)

crystallographic orientation and such that the epitaxial sacrificial feature 410 is formed with a hexagonal shape. In an embodiment, a formation of the epitaxial sacrificial feature 410 may start at epitaxially growing the semiconductor material over the substrate 210 (111) within the second opening 325, continually overgrowing and protruding from the second opening 325.

By way of example, epitaxial growth of the epitaxial sacrificial features 410 may be performed by a molecular beam epitaxial (MBE) process, a metalorganic chemical vapor deposition (MOCVD) process, and/or other suitable epitaxial growth processes. The epitaxial sacrificial features 410 may include silicon, germanium, a compound semiconductor such as silicon carbide, gallium arsenide, gallium phosphide, indium phosphide, indium arsenide, and/or indium antimonide, an alloy semiconductor such as InAs, SiGe, GaAsP, AlInAs, AlGaAs, InGaAs, GaInP, and/or GaInAsP, or combinations thereof.

Figure 5C:
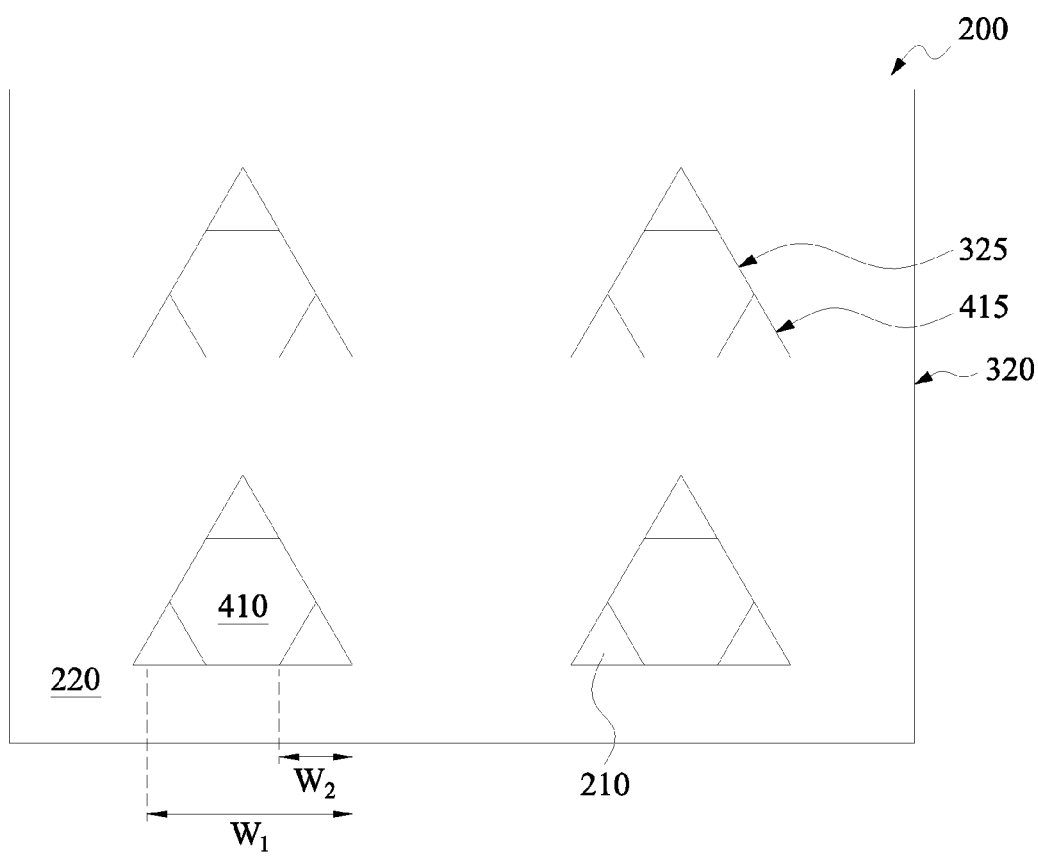

FIG. 5C illustrates, in another embodiment, the hexagonal-shape epitaxial sacrificial features 410 are formed within triangle-shape second openings 325. As discussed above, in alternative embodiments HM 310 can define any geometrical shape which is then transferred to first material layer 220 via the above described processes. For example, HM 310 can define geometrical shapes including, but not limited to, triangle shapes, circular shapes, rectangular shapes, and/or other suitable shapes which allows for second openings 325 to have the corresponding geometrical shape.

Figure 5D:
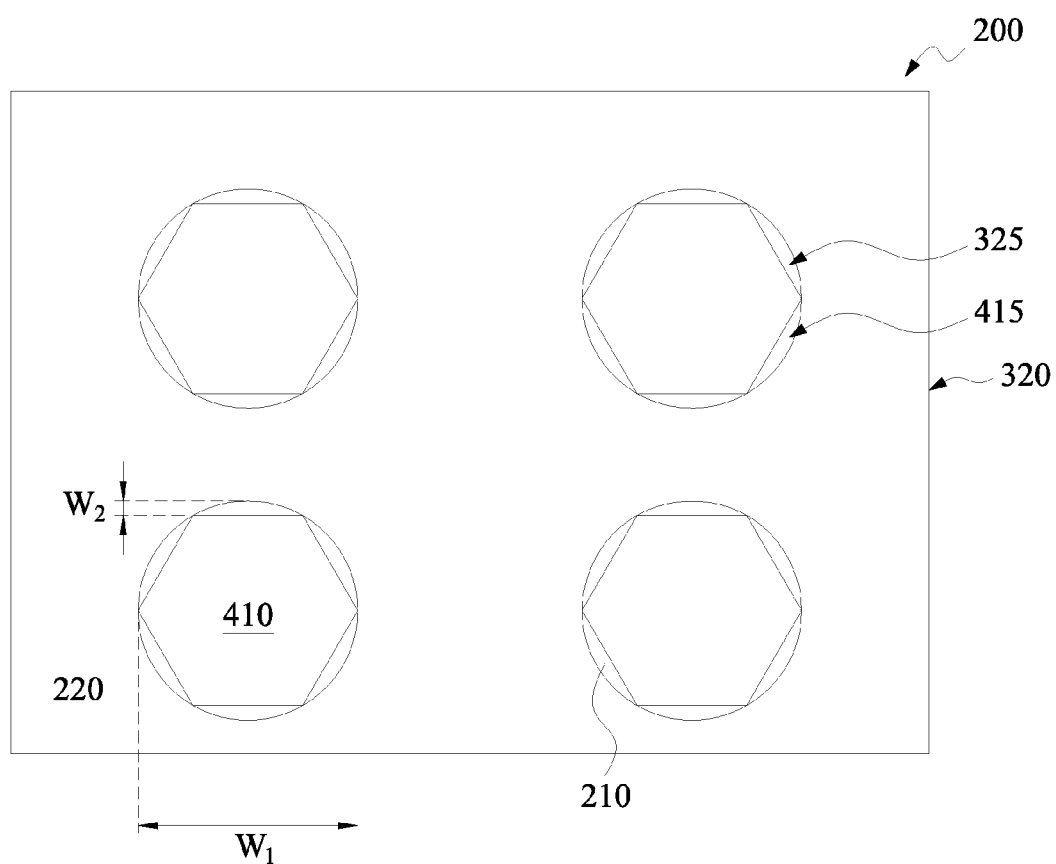

Also similarly, FIG. 5D illustrates, in yet another embodiment, the hexagonal-shape epitaxial sacrificial features 410 are formed within circular-shape second openings 325.

The following description will be directed to the embodiment of FIG. 5A, for the sake of example. It is understood that similar steps can be implemented on the embodiments of FIGS. 5C and 5D.

Figure 6A:
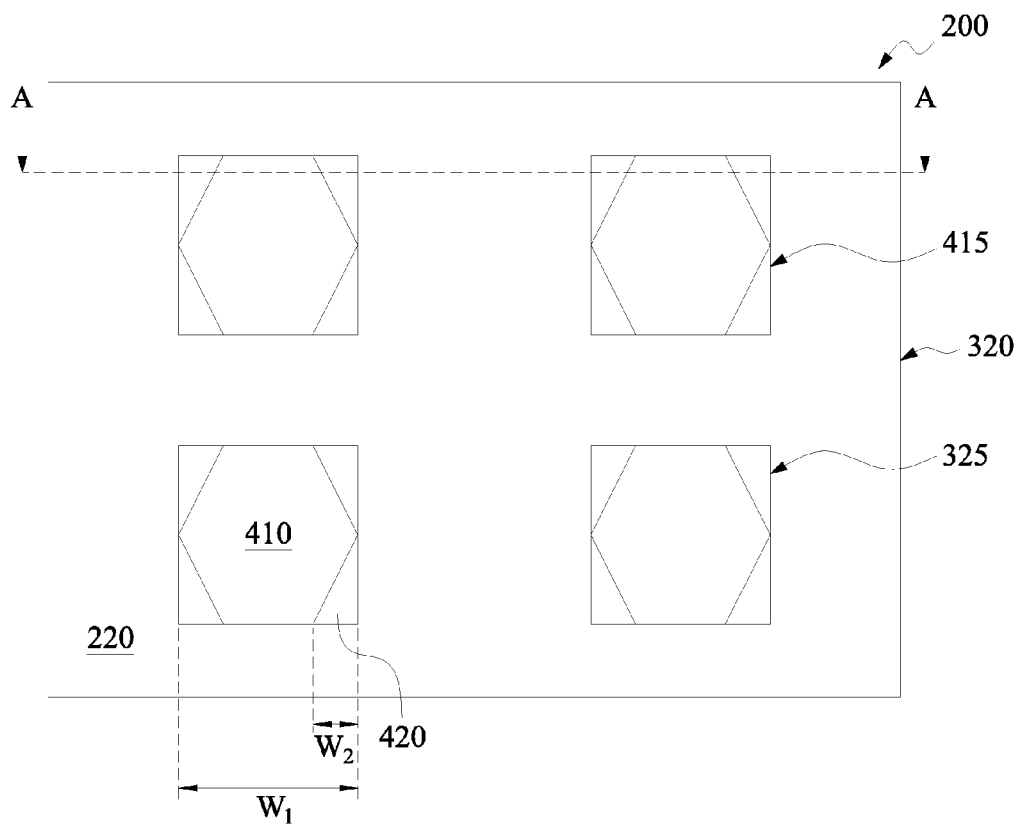
Figure 6B:
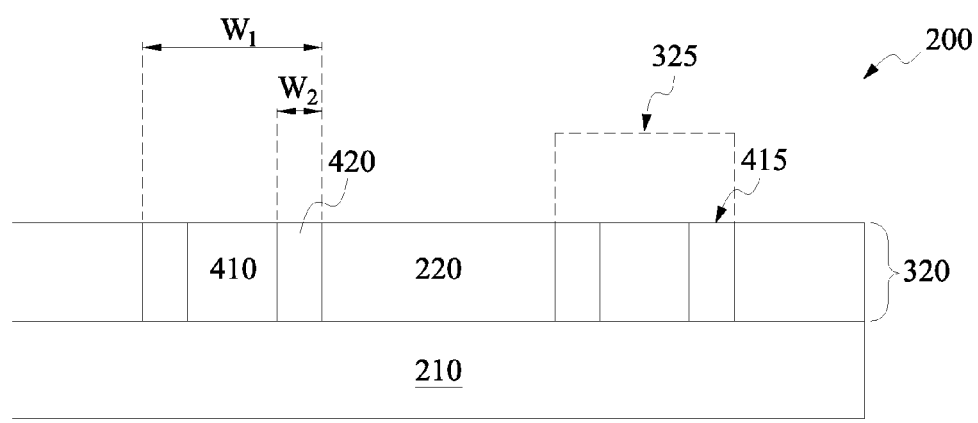

Referring to FIGS. 1, 6A and 6B, method 100 proceeds to step 110 by filling in non-uniform-width cavities 415 with a second material layer 420. In the present embodiment, the second material layer 420 may include a material which is different from the first material layer 220 and the sacrificial feature 410 to achieve etching selectivity during subsequent etch processes. The second material layer 420 may include silicon oxide, silicon nitride, silicon oxynitride, fluorine-doped silicate glass (FSG), a low-k dielectric, silicon carbide, titanium oxide, titanium nitride, tantalum oxide, tantalum nitride, combinations thereof, and/or other suitable materials. In various examples, the first material layer 220 may be deposited by CVD), ALD, PVD, thermal oxidation, spin-on coating, combinations thereof, or other suitable techniques. A chemical mechanical polishing (CMP) process may be performed to planarize the top surface of the second material layer 420. In some embodiments, the CMP process may also serve to remove portions of the sacrificial feature 410 protruding from the first material layer 220 and planarize a top surface of the semiconductor device 200.

Figure 7A:
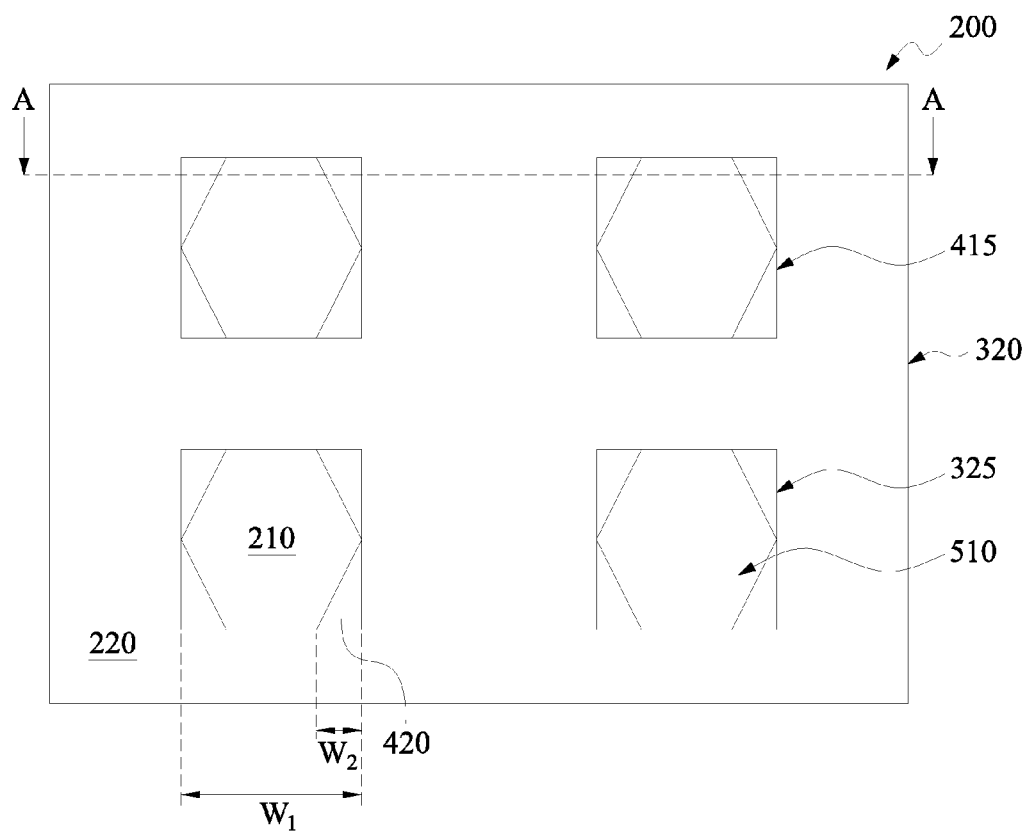
Figure 7B:
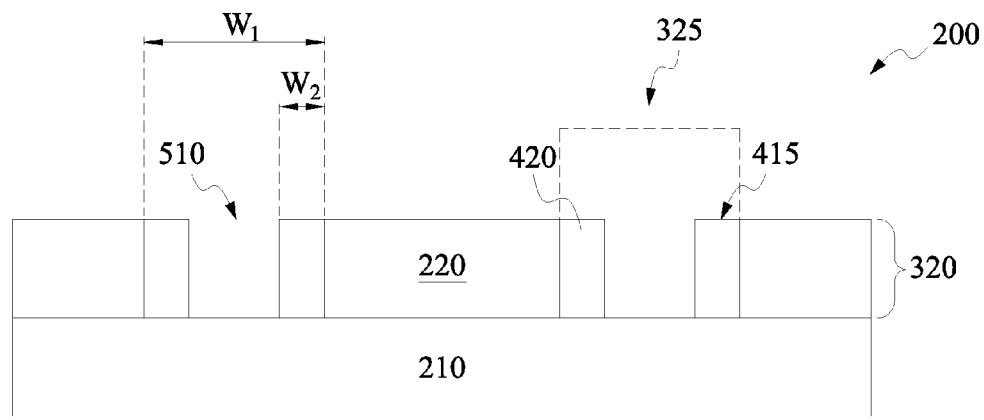

Referring to FIGS. 1, 7A and 7B, method 100 proceeds to step 112 by removing the sacrificial feature 410 to form trenches 510. As a result, the trench 510 carries the shape of the sacrificial feature 410. In an embodiment, the trench 510 carries hexagonal shape of the epitaxial sacrificial feature 410. In some embodiments, the etch process is chosen to selectively etch the sacrificial feature 410 without substantially etch the first material layer 220 and the second material layer 420. Thus the sacrificial features 410 are removed with a self-alignment nature, which relaxes etch process constrains. The etch process may include a selective wet etch, a selective dry etch, and/or a combination thereof. In one embodiment, a selective wet etching solution includes a tetramethylammonium hydroxide (TMAH), a $HF/HNO_3/CH_3COOH$ solution, or other suitable solution. Dry etching process may include a biased plasma etching process that uses a chlorine-based chemistry, such as such as $Cl_2$, $CHCl_3$, $CCl_4$, and/or $BCl_3$.

Figure 8A:
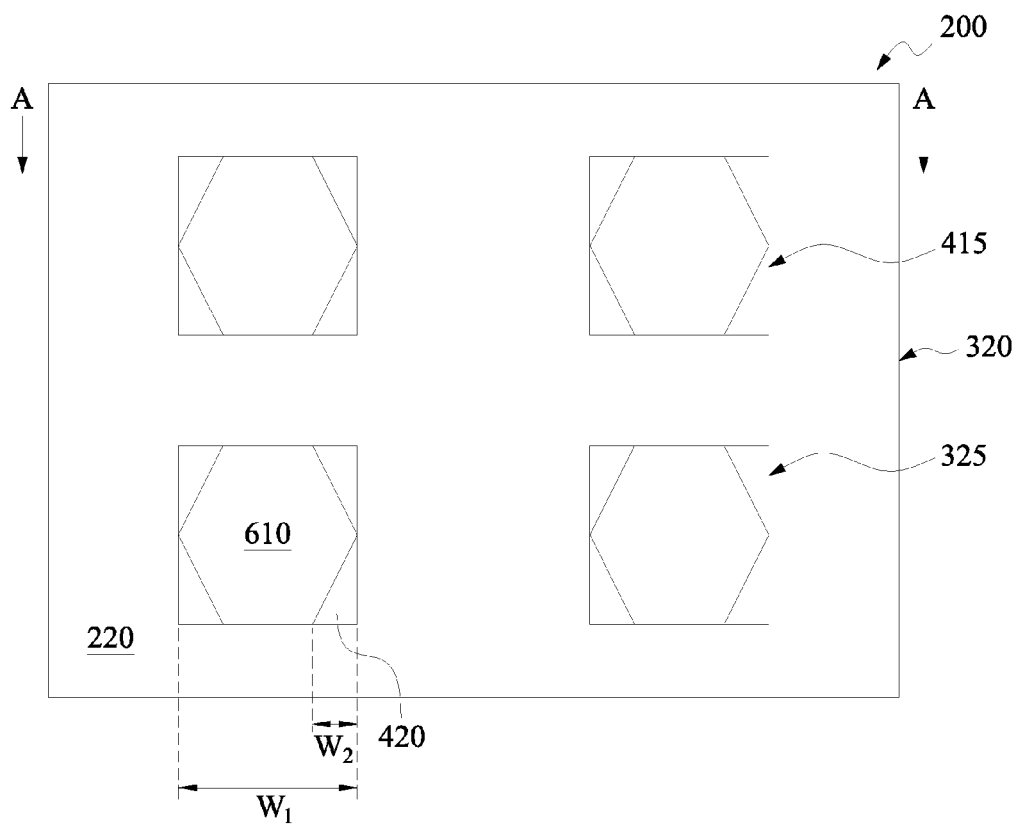
Figure 8B:
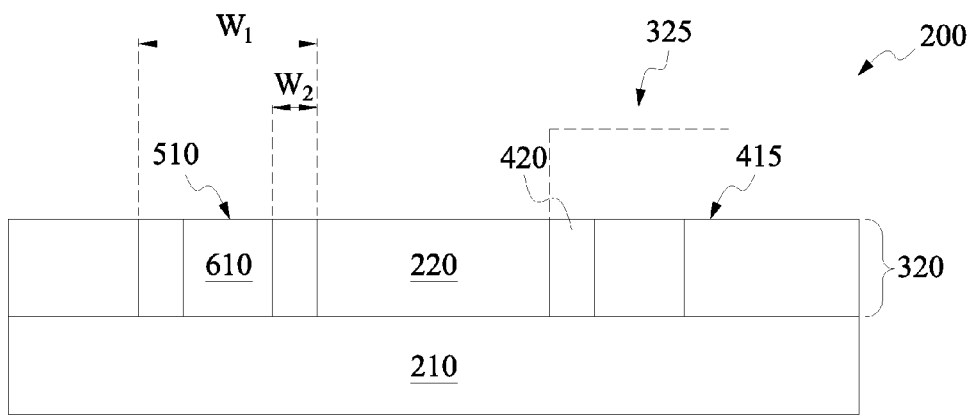

Referring to FIGS. 1, 8A and 8B, method 100 proceeds to step 114 by filling in the trench 510 with a third material layer 610. In the present embodiment, the third material layer 610 may include a material which is different from the second material layer 420 and the substrate 210 to achieve etching selectivity during subsequent etch processes. In an embodiment, the third material layer 610 is another first material layer 220. The third material layer 610 may include silicon oxide, silicon nitride, silicon oxynitride, fluorine-doped silicate glass (FSG), a low-k dielectric, silicon carbide, titanium oxide, titanium nitride, tantalum oxide, tantalum nitride, combinations thereof, and/or other suitable materials. In various examples, the first material layer 220 may be deposited by CVD), ALD, PVD, thermal oxidation, spin-on coating, combinations thereof, or other suitable techniques. A CMP may be performed to planarize the top surface of third material layer 610 such that the first, second and third material layers, 220, 420 and 610, are co-planar with each other.

Figure 9A:
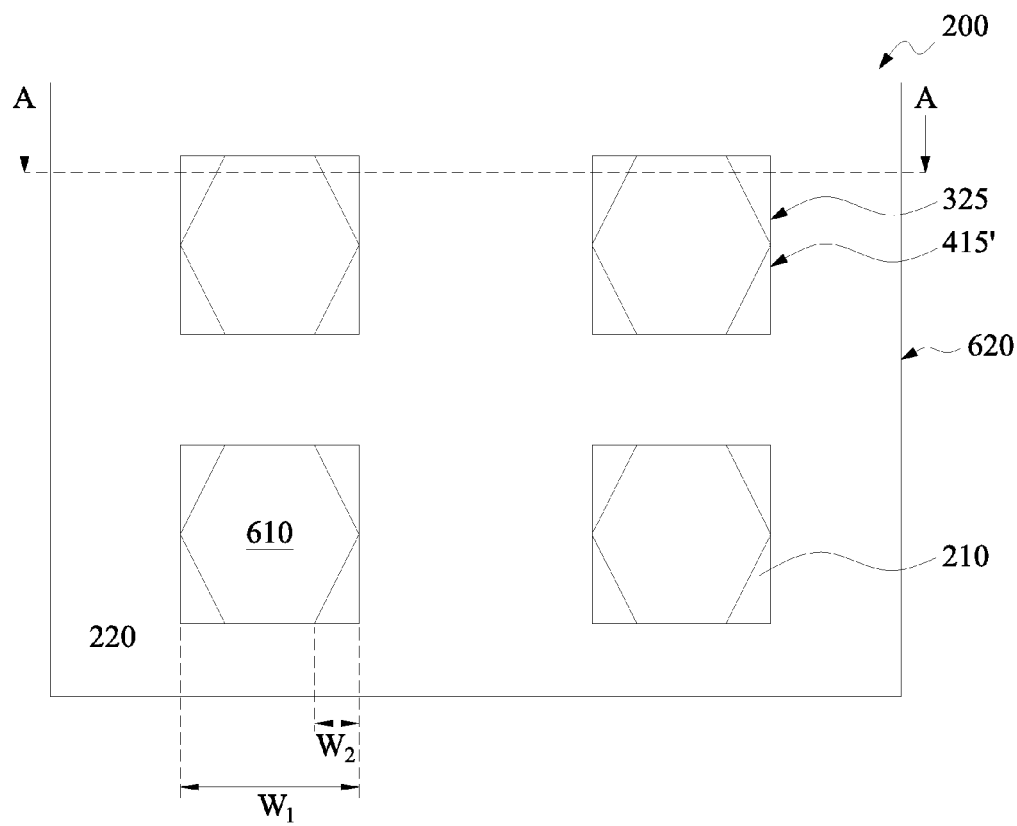
Figure 9B:
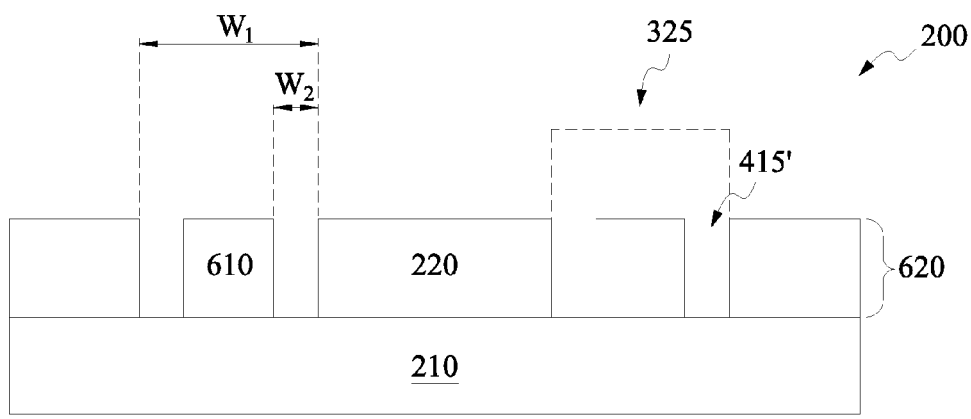

Referring to FIGS. 1, 9A and 9B, method 100 proceeds to step 116 by removing the second material layer 420 to reveal the non-uniform-width cavities 415 and form a second template 620. The revealed non-uniform-width cavity 415 is referred to as 415' and portions of the substrate 210 are exposed within the non-uniform-width cavities 415'. As a result, the second template 620 is formed by a plurality of the revealed non-uniform-width cavies 415' in the first material layer 220 and the third material layer 610. Thus, the first template 320 having the second openings 325 is replaced by the second template 620 having the non-uniform-width cavities 415'.

In some embodiments, the etch process is chosen to selectively etch the second material layer 420 without substantially etch the first material layer 220 and the third material layer 610. Thus, the second material layer 420 is removed with a self-alignment nature, which relaxes process constrains. The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), other suitable gases and/or plasmas, and/or combinations thereof.

Figure 10A:
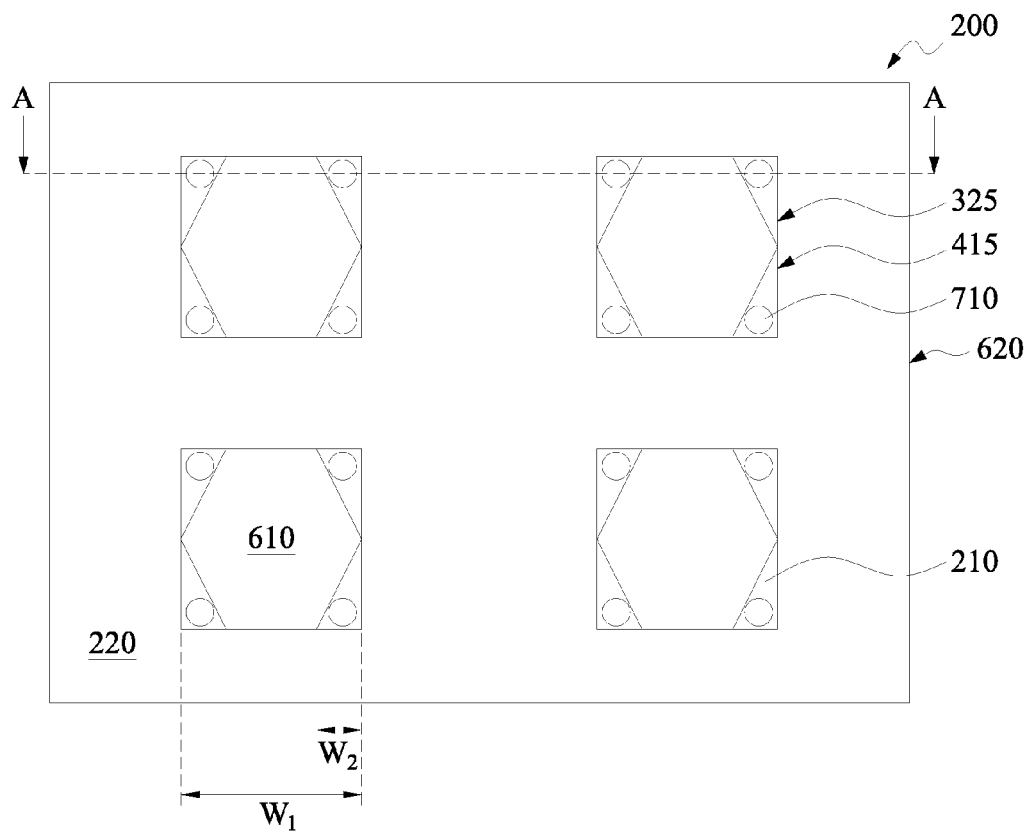
Figure 10B:
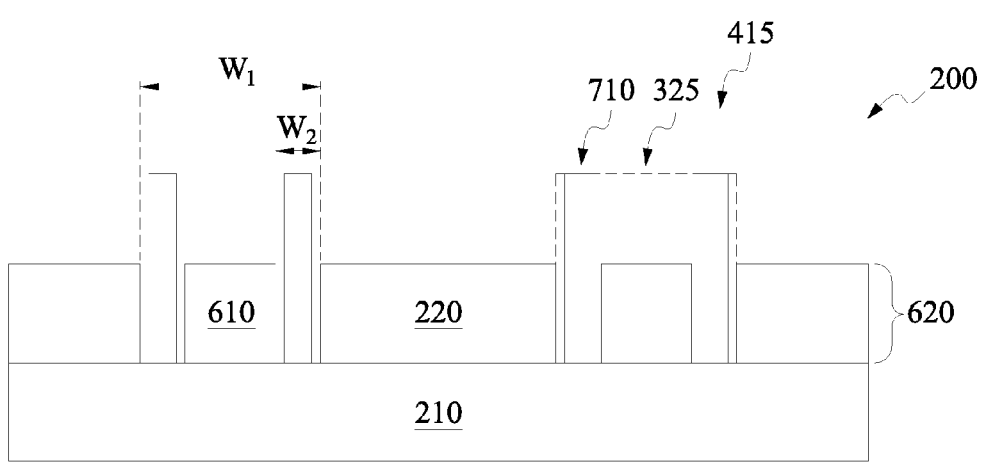

Referring to FIGS. 1, 10A and 10B, method 100 proceeds to step 118 by forming nano-features 710 within the non-uniform-width cavities 415'. As a result, a width of the nano-feature 710 is equal to or less than the second width $w_2$. As an example, the width of the nano-feature 710 is in a range from about 2 nm to about 25 nm while the second width w2 is in a range from about 5 nm to about 30 nm. In some embodiments, by controlling the second width $w_2$ of the non-uniform-width cavity 415', a single nano-feature 710 is formed within one non-uniform-width cavity 415' such that a layout of nano-features 710 carries the layout pattern of the second template 620. In some embodiments, more than one nano-feature 710 is formed in a single non-uniform-width cavity 415'. It is noted here that the dimension of the nano-feature 710 is achieved from the difference of two structures: the second opening 325 and the sacrificial feature 410. In words, the dimension of the nano-feature 710 is achieved by a non-lithography process. This dimension reduction via a non-lithography process is significant in that it allows for the utilization of smaller critical dimensions (CD). CD reduction is a challenge for lithography process, which become one of the limiting factors for future technology generations or nodes. Thus, the present disclosure provides a CD reduction method with a relaxed lithography process in the formation of a nano-feature.

In some embodiments, the nano-feature 710 is formed by epitaxial growing a semiconductor material over the semiconductor substrate 210, which is referred to as nanowires 710. As an example, the nanowires 710 are formed by epitaxial growing a indium arsenide (InAs) over the silicon substrate 210 having (111) crystallographic orientation within the non-uniform-width cavities 415', continually overgrowing and protruding from the non-uniform-width cavities 415'. The nanowires 710 are formed with hexagonal shapes. As has been mentioned above, by controlling the second width $w_2$ of the non-uniform-width cavity 415', a single nanowire 710 is formed within one non-uniform-width cavity 415'. It is believed that the nanowire will prefer to nucleate in the larger area because when a dimension (of the cavity 710) is reduced to less than 3 nm, there is much less chance to nucleate. So nucleation will occur in the larger area first and once the first nanowire has been nucleated, it will absorb the incoming atoms during epitaxial growing process and thus a second nanowire is unlikely to be nucleated.

Specifically, FIGS. 10A and 10B illustrate the nanowires 710 being formed in the non-uniform-width cavities 415' defined by the square-shape second opening 325 shown in FIGS. 5A and 5B. By way of example, epitaxial growth of the nanowire 710 may be performed by a MBE process, a MOCVD process, and/or other suitable epitaxial growth processes. The nanowires 710 may include silicon, germanium, a compound semiconductor such as silicon carbide, gallium arsenide, gallium phosphide, indium phosphide, indium arsenide, and/or indium antimonide, an alloy semiconductor such as InAs, SiGe, GaAsP, AlInAs, AlGaAs, InGaAs, GaInP, and/or GaInAsP, or combinations thereof.

Figure 10C:
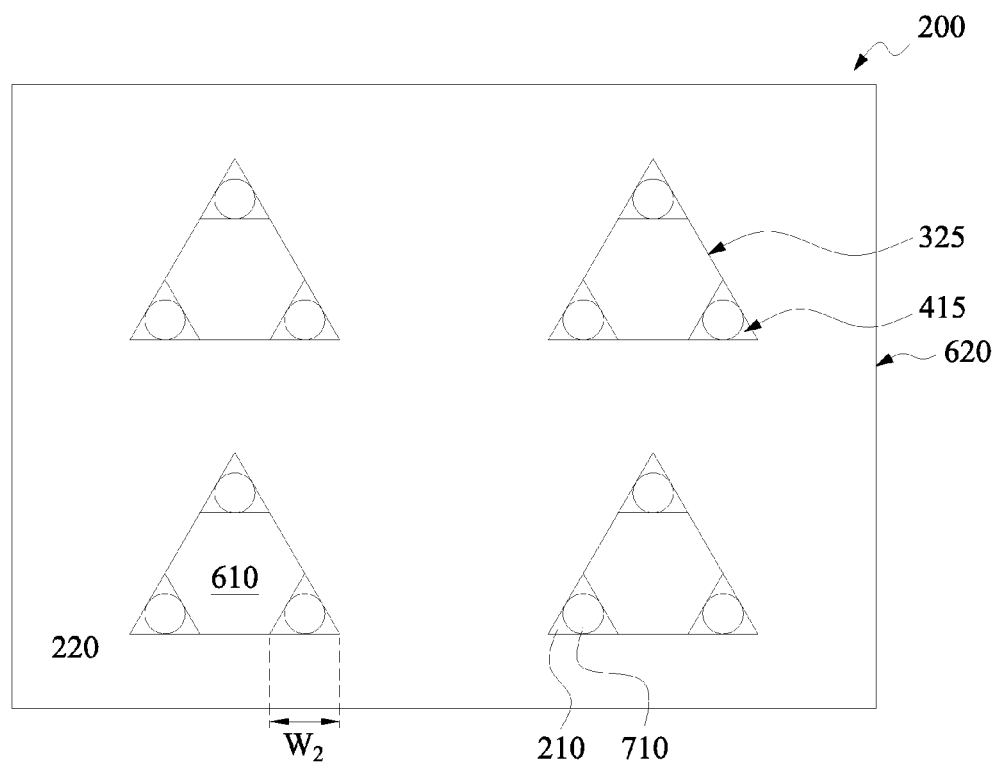

For circumstances where the hexagonal-shape epitaxial sacrificial features 410 are formed within triangle-shape second openings 325 (as shown in FIG. 5C), FIG. 10C illustrates nanowires 710 being formed in the non-uniform-width cavities 415' defined by the triangle-shape second opening 325 shown in FIG. 5C.

Figure 10D:
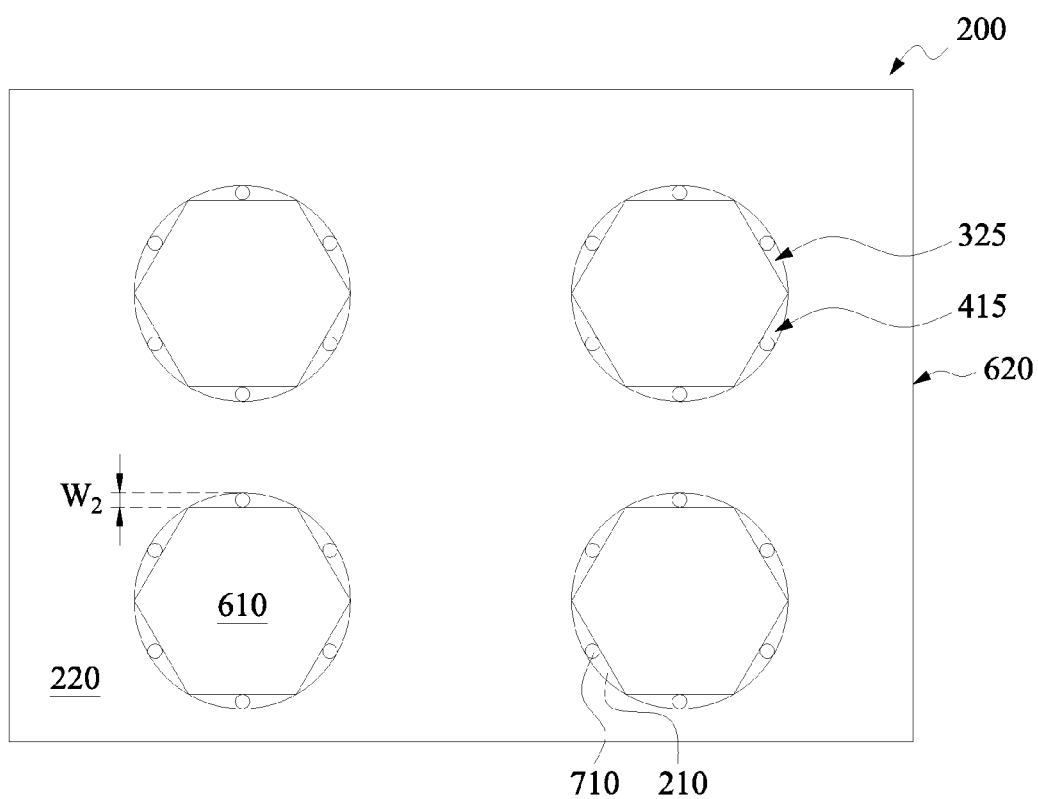

For circumstances where the hexagonal-shape epitaxial sacrificial features 410 are formed within circular-shape second openings 325 (as shown in FIG. 5D), FIG. 10D illustrates the nanowires 710 are formed in the non-uniform-width cavities 415' formed by the circular-shape second openings 325 shown in FIG. 5D.

Figure 11A:
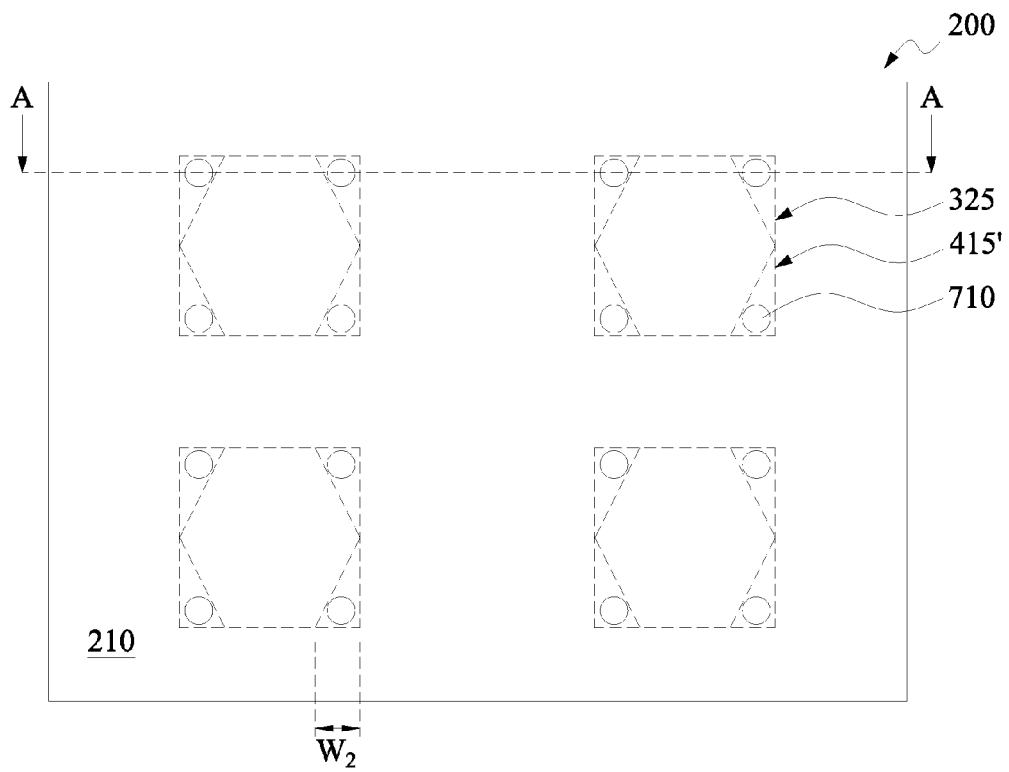
Figure 11B:
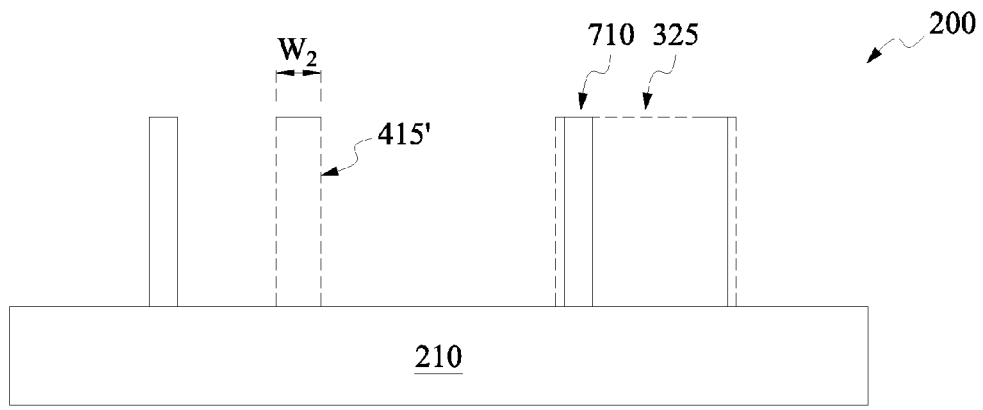

Additional process steps may be implemented before, during, and after method 100, and some process steps described above may be replaced or eliminated in accordance with various embodiments of method 100. As an example, after forming the nano-feature 710, the first material layer 220 is removed and leave nano-features 710 protrude from the substrate 210, as shown in FIGS. 11A and 11B. In some embodiments, the etch process is chosen to selectively etch the first material layer 220 without substantially etch the nano-features 710 and the substrate 210. Thus, the first material layer 220 is removed with a self-alignment nature, which relaxes process constrains. The etch process may include a wet etch, a dry etch, and/or a combination thereof.

Based on the above, it can be seen that the present disclosure provides methods of forming a nano-feature (e.g. nanowire). The method employs forming a nano-cavity by forming two structures with different shapes and then forming a nano-feature within the nano-cavity. With quite simple and feasible process integration, the method achieves critical dimension reduction with a relaxed lithography process and provides a robust process for nanowire formation.

The present disclosure provides many different embodiments of a method of forming a semiconductor device. The method includes forming a first material layer over a substrate. The first material layer has a sidewall defining a first opening, wherein the first opening has a first shape. The method also includes forming a sacrificial feature within the first opening and the sacrificial feature has a second shape, which is different than the first shape such that there is a cavity between an edge of the sacrificial feature and the sidewall of the first material layer. The method also includes filling in cavity with a second material layer, removing the sacrificial feature to form a second opening, filling in the second opening with a third material layer, removing the second material layer to reveal the cavity and forming a conductive feature within the cavity.

In another embodiment, a method includes forming a first material layer over a semiconductor substrate and the first material layer having a sidewall defining a first opening. The first opening has a first shape. The method also includes forming a epitaxial feature within the first opening and the epitaxial feature has a second shape that is different than the first shape such that a cavity is positioned between an edge of the epitaxial feature and the sidewall of the first material layer. The method also includes filling in the cavity with a second material layer, removing the epitaxial feature to form a trench, filling in the trench with a third material layer, removing the second material layer to reveal the cavity and forming a nanowire within the cavity.

In yet another embodiment, a method includes forming a first opening in a first material layer and the first opening has a first shape. The method also includes forming a first feature within the first opening and the first feature has a second shape that is different than the first shape such that a cavity extends from an edge of the first feature to a sidewall of the first material layer and the cavity has a non-uniform-width. The method also includes forming a nano-feature within the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
  forming a first material layer over a substrate, the first material layer having a sidewall defining a first opening, wherein the first opening has a first shape;
  forming a sacrificial feature within the first opening, wherein the sacrificial feature has a second shape which is different than the first shape such that there is a cavity between an edge of the sacrificial feature and the sidewall of the first material layer;
  filling in cavity with a second material layer;
  removing the sacrificial feature to form a second opening;

filling in the second opening with a third material layer;
removing the second material layer to reveal the cavity; and
forming a conductive feature within the cavity.

2. The method of claim 1, wherein the first shape includes a shape selected from the group consisting of a square shape, a triangle shape, and a circular shape.

3. The method of claim 1, wherein the cavity has a non-uniform-width.

4. The method of claim 1, wherein forming the sacrificial feature within the first opening includes epitaxially growing a semiconductor material over the substrate.

5. The method of claim 4, wherein the second shape is a hexagonal-shape.

6. The method of claim 1, wherein the conductive feature is a nanowire.

7. The method of claim 1, wherein the substrate has a (111) crystallographic orientation.

8. The method of claim 1, wherein forming the conductive feature within the cavity includes epitaxial growing a semiconductor material over the substrate.

9. The method of claim 8, wherein the conductive feature includes a single nano-feature formed within the cavity.

10. The method of claim 1, further comprising removing the first material layer after forming the conductive feature within the cavity.

11. A method comprising:
forming a first material layer over a semiconductor substrate, the first material layer having a sidewall defining a first opening, wherein the first opening has a first shape;
forming a epitaxial feature within the first opening, wherein the epitaxial feature has a second shape that is different than the first shape such that a cavity is positioned between an edge of the epitaxial feature and the sidewall of the first material layer;
filling in the cavity with a second material layer;
removing the epitaxial feature to form a trench;
filling in the trench with a third material layer;
removing the second material layer to reveal the cavity; and
forming a nanowire within the cavity.

12. The method of claim 11, wherein the first shape includes a shape selected from the group consisting of a square shape, a triangle shape, and a circular shape.

13. The method of claim 11, wherein forming the epitaxial sacrificial feature within the first opening includes epitaxially growing a semiconductor material over the semiconductor substrate.

14. The method of claim 11, wherein the first material and the third material are formed of the same material.

15. The method of claim 14, wherein the second material is formed of a different material than the first material.

16. The method of claim 11, wherein forming the nano-feature within the cavity includes epitaxially growing a semiconductor material over the semiconductor substrate.

17. The method of claim 16, wherein forming the nanowire within the cavity includes forming a single nano-feature within the cavity.

18. The method of claim 11, wherein the cavity has a non-uniform-width.

19. The method of claim 11, further comprising removing the first material layer after forming the nano-feature within the cavity.

20. A method comprising:
forming a first opening in a first material layer, the first opening has a first shape;
forming a first feature within the first opening, wherein the first feature has a second shape that is different than the first shape such that a cavity extends from an edge of the first feature to a sidewall of the first material layer, wherein the cavity has a non-uniform-width; and
forming a nano-feature within the cavity.

* * * * *